(12) United States Patent
Nagashima et al.

(10) Patent No.: US 6,404,628 B1
(45) Date of Patent: Jun. 11, 2002

(54) INTEGRATED POWER ELECTRONICS COOLING HOUSING

(75) Inventors: James M. Nagashima, Cerritos; Terence G. Ward, Redondo Beach; Scott D. Downer, Torrance, all of CA (US)

(73) Assignee: General Motors Corporation, Detroit, MI (US)

( * ) Notice: Subject to any disclaimer, the term of this patent is extended or adjusted under 35 U.S.C. 154(b) by 87 days.

(21) Appl. No.: 09/621,379

(22) Filed: Jul. 21, 2000

(51) Int. Cl.[7] ................................. H05K 7/20
(52) U.S. Cl. ................ 361/690; 165/104.33; 174/52.2; 361/699
(58) Field of Search .................. 174/15.1, 15.4, 174/252, 59, 60, 52.2, 52.3, 52.4; 257/714; 165/80.3, 185, 80.4, 104.33; 361/679, 688, 689, 699, 702–704, 707, 710, 717–722, 690

(56) References Cited

U.S. PATENT DOCUMENTS

| | | | | |
|---|---|---|---|---|
| 3,586,917 A | * | 6/1971 | Oates ........................ 361/688 |
| 4,120,019 A | * | 10/1978 | Arii et al. ................... 361/699 |
| 4,331,830 A | * | 5/1982 | Conway et al. ............ 174/16.1 |
| 4,381,032 A | * | 4/1983 | Cutchaw ...................... 165/46 |
| 4,652,970 A | * | 3/1987 | Watari et al. ............... 361/699 |
| 5,268,814 A | * | 12/1993 | Yakubowski ............... 361/704 |
| 5,675,473 A | * | 10/1997 | McDunn et al. ............ 361/699 |
| 5,841,634 A | * | 11/1998 | Visser ......................... 361/699 |
| 5,871,042 A | * | 2/1999 | Gutfeldt et al. ............... 165/70 |

* cited by examiner

*Primary Examiner*—Gerald Tolin
(74) *Attorney, Agent, or Firm*—Christopher DeVries

(57) ABSTRACT

A power electronics cooling housing for use in a power electronics system. The power electronics cooling housing has a body with a coolant cavity formed in one surface and a capacitor bus assembly potting cavity formed in an opposite surface. A bus bar passthrough opening is formed through the body. The bus bar passthrough opening provides an opening from the coolant cavity and the capacitor bus assembly potting cavity. A coolant inlet manifold having a coolant cavity inlet and a coolant outlet manifold having a coolant cavity outlet are formed in the body that are coupled to respective ends of the coolant cavity. An environmental sealing gasket surrounds the coolant cavity.

17 Claims, 2 Drawing Sheets

INTEGRATED POWER ELECTRONICS COOLING HOUSING

BACKGROUND OF THE INVENTION

The present invention relates generally to electric vehicles and, more particularly, to an integrated power electronics cooling housing for use in a power electronics system.

The assignee of the present invention manufactures electric vehicles. The electric vehicle comprises a power electronics system that is used to distribute electrical power to various components in the vehicle.

Prior art related to cooling of power electronics systems involves liquid cooling of power semiconductor devices using a discrete heat exchanger electrically connected to a chassis, combined with air cooling of other dissipating components (either directly to air or by conduction to chassis and air cooling of the chassis). Disadvantages of conventional cooling arrangements are as follows.

The heat exchanger is only used once for the power semiconductor devices. Air cooling of other heat-dissipating components is less effective than cooling provided by a liquid cooling path, which results in higher operating temperatures and lower reliability. The capacitance of the power semiconductor devices relative to the chassis is higher, which results in higher injected currents that generate electromagnetic interference (EMI).

It would, therefore, be desirable to have an integrated power electronics cooling housing for use in a power electronics system such as may be used in an electric vehicle, for example, that overcomes the limitations of conventional implementations.

SUMMARY OF THE INVENTION

The present invention comprises a power electronics cooling housing for use in a power electronics system. The power electronics cooling housing comprises a body having a coolant cavity formed in one surface and having a capacitor bus assembly potting cavity formed in an opposite surface. A bus bar passthrough opening is formed through the body. The bus bar passthrough opening provides an opening from the coolant cavity and the capacitor bus assembly potting cavity. A coolant inlet manifold having a coolant cavity inlet and a coolant outlet manifold having a coolant cavity outlet are formed in the body that are coupled to respective ends of the coolant cavity. An environmental sealing gasket surrounds the coolant cavity.

All power-dissipating components coupled to the housing are liquid-cooled by the same coolant loop. The housing is designed to accept a thermal plate and environmental sealing gasket for use with high power dissipating devices. The housing has coolant inlet and outlet ports, a coolant cavity, thermal interfaces and component mounting and potting features. Low power-dissipating devices are cooled through the housing by the coolant loop. The housing is designed for automotive and other dynamic environments. The housing is designed to have a minimal part count and a low number of electrical interconnects to provide higher reliability. All electronic components may be electrically isolated from the chassis for EMI shielding and safety if the housing is made of dielectric material.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DESCRIPTION OF THE PREFERRED EMBODIMENT

Figure 1:
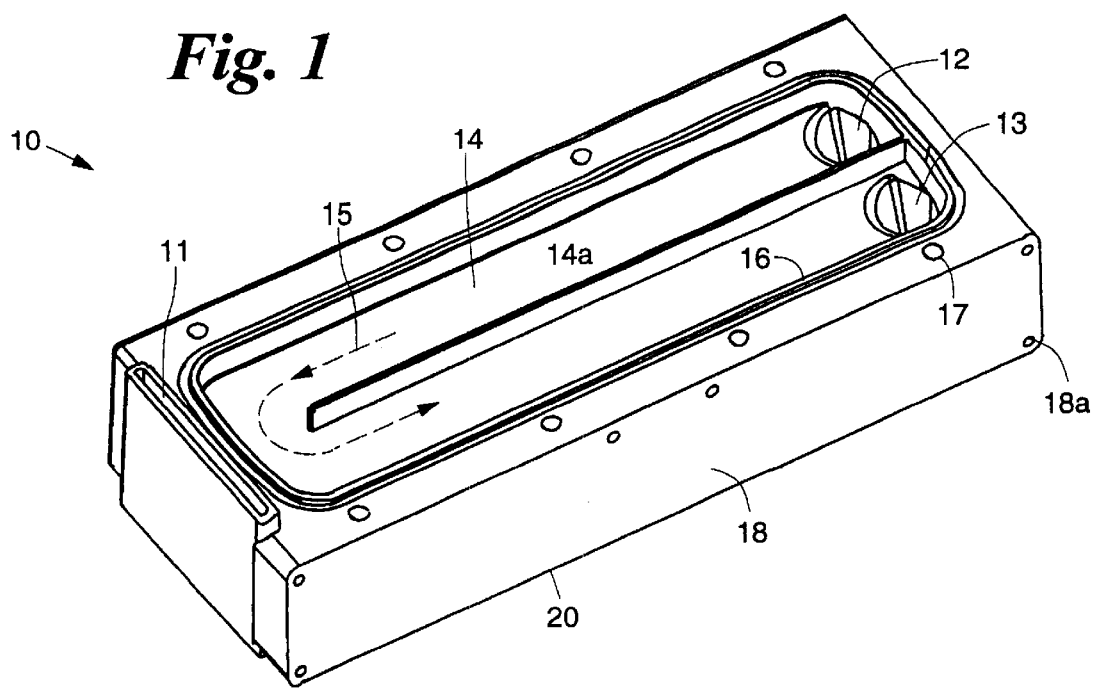
FIG. 1 is a perspective view of an exemplary power electronics cooling housing in accordance with the principles of the present invention.
Figure 2:
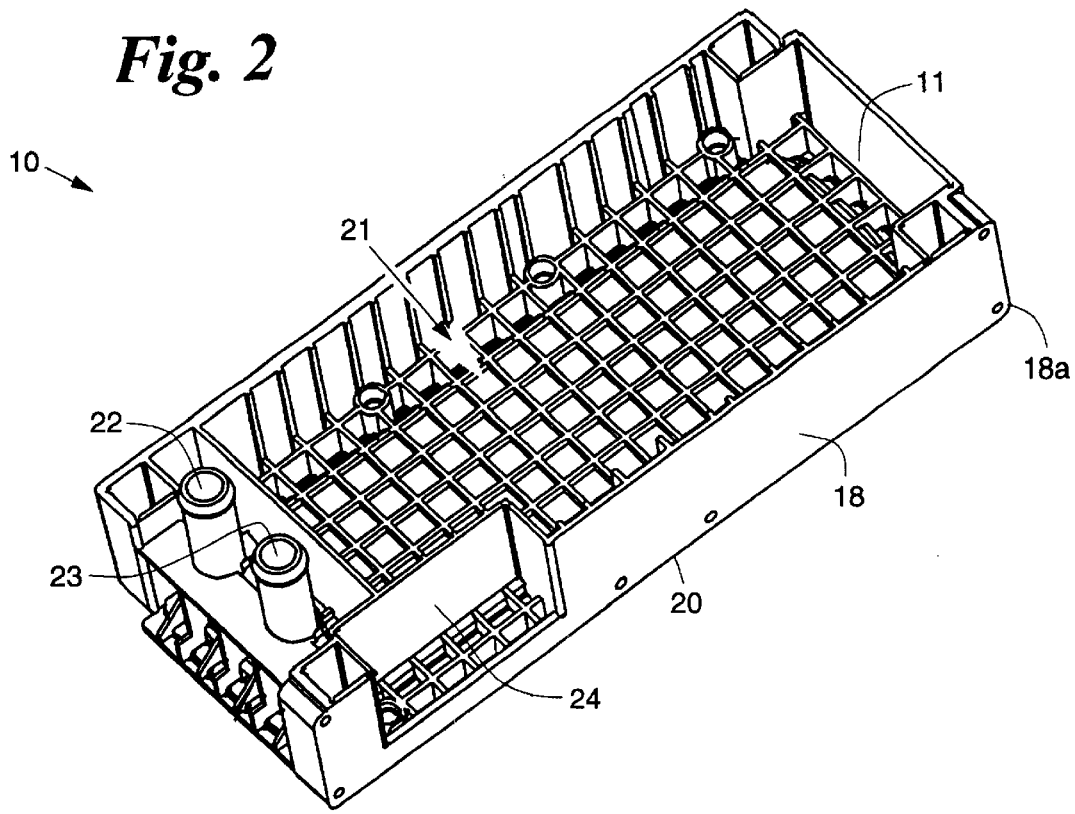
FIG. 2 is a perspective view of the bottom of the power electronics cooling housing of FIG. 1.
Figure 3:
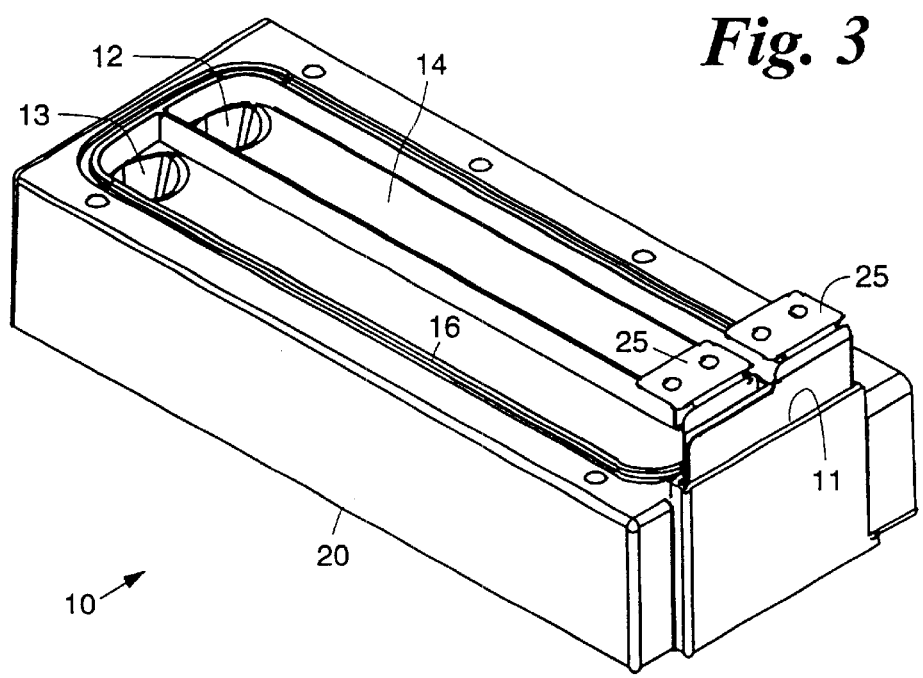
FIG. 3 is another perspective view of the power electronics cooling housing of FIG. 1.

Referring to the drawing figures, FIG. 1 is a perspective view of an exemplary power electronics cooling housing 10 in accordance with the principles of the present invention. FIG. 2 illustrates a perspective view of the bottom of the housing 10 shown in FIG. 1. FIG. 3 shows another perspective view of the housing 20.

The exemplary power electronics cooling housing 10 comprises a generally rectangular body 20 which is preferably plastic or dielectric material and which is manufactured using relatively low cost injection-molded construction techniques. The body 20 is relatively narrow having narrow ends and relatively elongated sides. The body 20 has a bus bar passthrough opening 11 at one end into which bus bars 25 (FIG. 3) are disposed when the power electronics system 30 is assembled.

A coolant cavity inlet 12 and coolant cavity outlet 13 are provided at the opposite end of the body 20 from the bus bar passthrough opening 11. The coolant cavity inlet 12 and outlet 13 open to a U-shaped coolant cavity 14 formed adjacent the top of the body 20. Coolant 14a is caused to flow into the inlet 12, through the U-shaped coolant cavity 14 and out the outlet 13 as is illustrated by the dashed U-shaped arrow 15.

An environmental sealing gasket 16 surrounds the coolant cavity 14 at the top surface of the body 20. The environmental sealing gasket 16 is applied to the perimeter of and surrounds the coolant cavity 14. Thermal plate mounting holes 17 are formed in the top surface of the body 20 surrounding the environmental sealing gasket 16. A circuit board mounting surface 18 is provided on each elongated side of the body 20 including a plurality of mounting holes 18a.

As is shown in FIG. 2, the bottom of the power electronics cooling housing 10 has a relatively large cavity 21 comprising a capacitor bus assembly potting cavity. A capacitor bus assembly (not shown) is secured in the cavity 21 using potting cement (not shown) when the power electronics system 30 is assembled. The coolant cavity inlet 12 and outlet 13 shown in FIG. 1 are respectively coupled to a coolant inlet manifold 22 and coolant outlet manifold 23 formed as part of the body 20 that are coupled to a coolant source (not shown) including a pump and radiator, for example.

A portion of the body 20 is configured to provide a connector housing 24 having a metallized surface that provides electrical shielding. A portion of the circuit board mounting surface 18 not seen in FIG. 1 is shown on the elongated side of the body 20 next to the connector housing 24, which also includes a plurality of the mounting holes 18a.

As is shown in FIG. 3, the bus bar passthrough opening 11 has a plurality of laminated copper bus bars 25 disposed therethrough that conduct current though the power electronics cooling housing 10.

Figure 4:
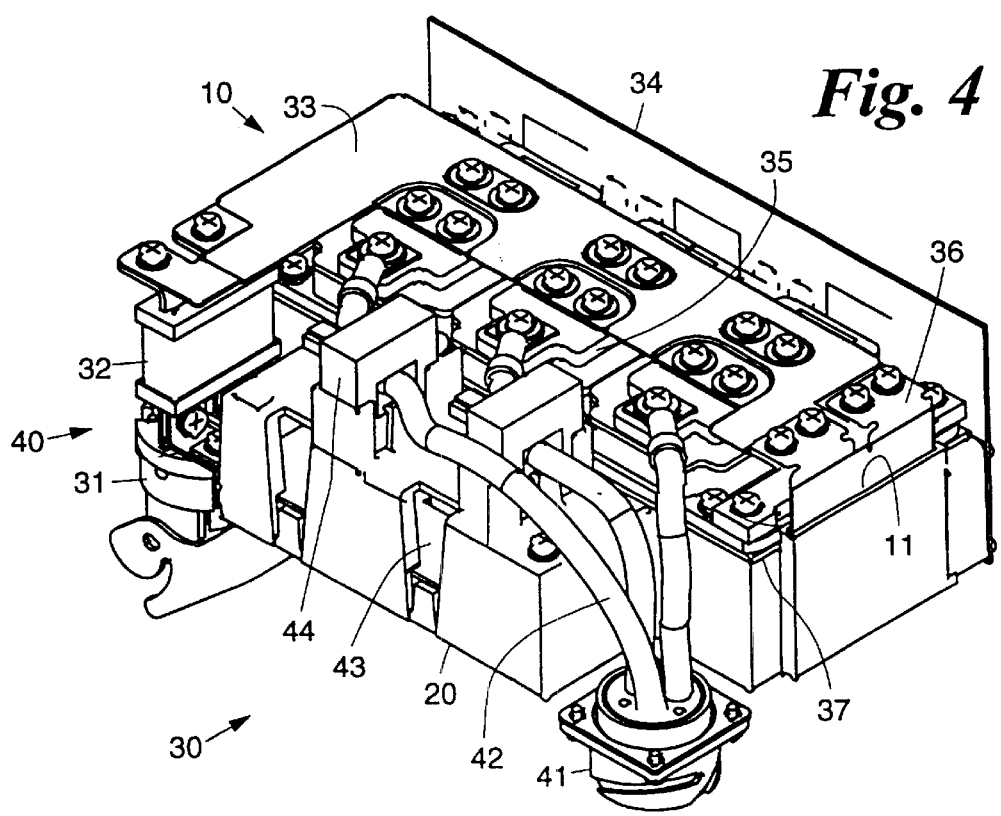
FIG. 4 illustrates a perspective view of a power electronics system contained in the power electronics cooling housing of FIGS. 1–3.

The power electronics cooling housing 10 is preferably employed as part of a power electronics system 30 to provide integrated cooling therefor. FIG. 4 is a perspective view of an exemplary power electronics system 30 that employs the power electronics cooling housing 10. As is shown in FIG. 4, the power electronics cooling housing 10 forms the central component in the system 30.

The laminated copper bus bars 25 are disposed in the passthrough opening 11 and are respectively coupled to horizontal bus bars of a flat, L-shaped laminated horizontal bus bar assembly 33 that extends along the length of the housing 10 above the U-shaped coolant cavity 14. A battery input connector 31 is cast or formed in a chassis (not shown) adjacent to the housing 10. An input EMI choke 32, or common-mode choke 32, is incorporated in a vertical bus bar assembly 40 that couples the battery input connector 31 to the horizontal bus bar assembly 33.

Input power is distributed to a plurality of IGBT modules 35 comprising power switching devices by way of the laminated horizontal bus bar assembly 33. The plurality of IGBT modules 35 are mounted to a pin-fin heat sink 37. The integral pin-fin heat sink 37 is mounted with the environmental sealing gasket 16 to the body 20 of the housing 10, which provides a coolant channel 14 for immersion of the pin-fins. The laminated copper bus bars 25 connect capacitors potted in the cavity 21 in the under side of the body 20 to the horizontal bus bar assembly 33 which distributes power to the IGBT modules 35.

A control printed circuit board 34 is mounted to one side of the body 20 which provides a mechanical attachment using the plurality of mounting holes 18a formed in the circuit board mounting surface 18. The circuit board mounting surface 18 also provides a thermal interface for the control printed circuit board 34. EMI PCB mechanical retention 43 is incorporated in the body 20 of the housing 10 to retain the control printed circuit board 34.

A motor connector 41 has a wiring harness 42 containing wires that are coupled to the plurality of IGBT modules 35. A plurality of mechanical retention elements 44 are incorporated in the body 20 that retain current sensors (not shown) in the motor signal path.

A signal connector back-shell (not shown) is incorporated in the body 20 of the housing 10. The signal connector back-shell couples control signals to the control printed circuit board 34. Capacitors and capacitor bus bars (not shown) are potted in the cavity 21.

The power electronics cooling housing 10 may be manufactured using relatively low cost injection-molded plastic construction techniques. There are fewer components in the power electronics cooling housing 10 than in conventional housings, and it is easier to manufacture and allows reduced assembly time for the power electronics system 30 in which it is employed. Use of the power electronics cooling housing 10 results in a smaller physical system size. The power electronics cooling housing 10 has fewer and improved thermal interfaces and provides better cooling, as compared to conventional housings. The power electronics cooling housing has higher reliability because it has fewer parts and provides improved cooling. The power electronics cooling housing 10 generates lower electromagnetic interference due to the reduced capacitance between the housing 10 and the chassis.

The power electronics cooling housing may be advantageously employed in electric vehicles such as those manufactured by the assignee of the present invention and in electric vehicle charging systems for use in charging propulsion batteries of such electric vehicles. The housing may also be adapted for use with inverters, power supplies, and other power electronics devices.

Thus, an improved integrated power electronics cooling housing for use in a power electronics system used with an electric vehicle has been disclosed. It is to be understood that the above-described embodiment is merely illustrative of one of the many specific embodiments that represent applications of the principles of the present invention. Clearly, numerous and other arrangements can be readily devised by those skilled in the art without departing from the scope of the invention.

What is claimed is:

1. A power electronics cooling housing comprising:
   a body having a coolant cavity formed in one surface and having a capacitor bus assembly potting cavity formed in an opposite surface and a capacitor bus assembly potting located in the capacitor bus assembly potting cavity;
   a bus bar passthrough opening formed through the body and a bus bar located in the bus bar passthrough;
   a coolant inlet manifold having a coolant cavity inlet and a coolant outlet manifold having a coolant cavity outlet formed in the body that are coupled to respective ends of the coolant cavity; and
   an environmental sealing gasket surrounding the coolant cavity.

2. The housing recited in claim 1 wherein the body comprises dielectric material.

3. The housing recited in claim 1 wherein the body comprises plastic.

4. The housing recited in claim 1 wherein the coolant cavity comprises a U-shaped coolant cavity.

5. The housing recited in claim 1 wherein a portion of the body provides a connector housing having a metallized surface that provides electrical shielding for a connector.

6. The housing recited in claim 1 further comprising a circuit board mounting surface on selected sides of the body.

7. A power electronics cooling housing comprising:
   a body having a coolant cavity formed in one surface and having a capacitor bus assembly potting cavity formed in an opposite surface;
   a bus bar passthrough opening formed through the body to provide a passage between the coolant cavity and the capacitor bus assembly potting cavity;
   a coolant inlet manifold having a coolant cavity inlet and a coolant outlet manifold having a coolant cavity outlet formed in the body that are coupled to respective ends of the coolant cavity; and
   an environmental sealing gasket surrounding the coolant cavity.

8. The housing recited in claim 7 wherein the body comprises dielectric material.

9. The housing recited in claim 7 wherein the body comprises plastic.

10. The housing recited in claim 7 wherein the coolant cavity comprises a U-shaped coolant cavity.

11. The housing recited in claim 7 wherein a portion of the body provides a connector housing having a metallized surface that provides electrical shielding for a connector.

12. The housing recited in claim 7 further comprising a circuit board mounting surface on selected sides of the body.

13. A power system for use in an electric vehicle comprising:
- power electronics for distribution of power in the electric vehicle;
- an electronics cooling housing including a body having a U-shaped coolant cavity formed in one surface and having a capacitor bus assembly potting cavity formed in an opposite surface;
- a bus bar passthrough opening formed through the body;
- a coolant inlet manifold having a coolant cavity inlet and a coolant outlet manifold having a coolant cavity outlet formed in the body that are coupled to respective ends of the U-shaped coolant cavity; and
- an environmental sealing gasket surrounding the coolant cavity.

14. The housing recited in claim 13 wherein the body comprises dielectric material.

15. The housing recited in claim 13 wherein the body comprises plastic.

16. The housing recited in claim 13 wherein a portion of the body provides a connector housing having a metallized surface that provides electrical shielding for a connector.

17. The housing recited in claim 13 further comprising a circuit board mounting surface on selected sides of the body.

* * * * *